(12) United States Patent
Yates

(10) Patent No.: US 8,454,760 B2
(45) Date of Patent: Jun. 4, 2013

(54) WAFER CLEANING WITH IMMERSED STREAM OR SPRAY NOZZLE

(75) Inventor: Donald L. Yates, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 12/476,139

(22) Filed: Jun. 1, 2009

(65) Prior Publication Data

US 2010/0300491 A1 Dec. 2, 2010

(51) Int. Cl.
*B08B 3/02* (2006.01)

(52) U.S. Cl.
USPC .............. 134/34; 134/26; 134/32; 134/36

(58) Field of Classification Search
None
See application file for complete search history.

(56) References Cited

U.S. PATENT DOCUMENTS

| | | | |
|---|---|---|---|
| 5,244,000 A * | 9/1993 | Stanford et al. | 134/95.1 |
| 5,540,247 A * | 7/1996 | Kawatani et al. | 134/182 |
| 5,850,841 A * | 12/1998 | Han et al. | 134/86 |
| 5,865,901 A | 2/1999 | Yin et al. | |
| 6,227,212 B1 | 5/2001 | Konishi et al. | |
| 6,431,185 B1 * | 8/2002 | Tomita et al. | 134/1.3 |
| 6,491,043 B2 | 12/2002 | Mohindra et al. | |
| 6,551,409 B1 | 4/2003 | DeGendt et al. | |
| 6,558,478 B1 * | 5/2003 | Katakabe et al. | 134/33 |
| 6,638,366 B2 | 10/2003 | Lammert et al. | |
| 6,875,284 B2 | 4/2005 | Scranton | |
| 7,077,916 B2 | 7/2006 | Deguchi | |
| 2002/0062840 A1 * | 5/2002 | Verhaverbeke et al. | 134/1.3 |
| 2002/0166569 A1 * | 11/2002 | Harvey et al. | 134/1.3 |

FOREIGN PATENT DOCUMENTS

| | | | |
|---|---|---|---|
| JP | 08-033876 | * | 2/1996 |
| JP | 10-154678 | * | 6/1998 |

OTHER PUBLICATIONS

Machine Translation of JP08-033876 by Okamura et al., published Feb. 6, 1996.*
Machine Translation of JP10-154678 by Hirano et al., published Jun. 9, 1998.*

* cited by examiner

*Primary Examiner* — Michael Kornakov
*Assistant Examiner* — Ryan Coleman
(74) *Attorney, Agent, or Firm* — Perkins Coie LLP

(57) ABSTRACT

Several methods of removing contaminant particles from a surface of a substrate are disclosed herein. In one embodiment, the method includes directing an incompressible fluid spray onto a surface of a substrate to remove contaminant particles from the surface. In an embodiment, the surface of the substrate and the nozzle are both immersed in an incompressible fluid. The fluid can flow across the surface of the substrate to remove the contaminant particles from the area. The fluid spray can be positioned normal to the substrate surface, or can be positioned at an angle relative to the substrate surface.

27 Claims, 6 Drawing Sheets

WAFER CLEANING WITH IMMERSED STREAM OR SPRAY NOZZLE

TECHNICAL FIELD

The present disclosure is related to methods of cleaning of wafers with an immersed stream or spray nozzle and associated systems and apparatuses.

BACKGROUND

Semiconductor substrates are an important part of many microelectronic devices used in computing devices, cell phones, and other electronic equipment. The market for these devices demands increasingly small, intricate, and delicate features. During the manufacturing of these devices, features are created on and below the surface of the substrates. Intermediate manufacturing processes that create the features often leave residual particles or other contaminants on substrate and feature surfaces, such as liquid-borne contaminants or reactor chamber particles commonly encountered in semiconductor manufacturing. Because feature dimensions now approach the size of the residual particles and aspect ratios are increasing, the particles can substantially fit into small grooves or other negative spaces of features. This makes it difficult to remove the residual particles. Additionally, very small features are fragile and therefore susceptible to damage from the cavitational and/or other kinetic forces of conventional cleaning techniques. As such, there is a need in the art for a cleaning system and process that sufficiently removes residual particles from the surface of a substrate without unacceptably damaging the substrate features.

FIGS. 1-3 illustrate examples of existing methods of removing residue and particles from a substrate surface. One disadvantage of these methods is that the energy levels at the substrate surface required to adequately remove a sufficient quantity of particles may damage the features at the substrate surface. FIG. 1 illustrates a nano-spray method in which a nozzle 110 is positioned above a substrate 120 in a gas-ambient environment 130 (e.g., air, nitrogen, etc.). A spray 140 is directed from the nozzle 110 onto a surface of the substrate 120. The spray 140 can comprise either an atomized spray (containing incompressible and compressible fluids) or a fluid spray (incompressible fluid only). Nano-spray methods remove more particles as the force of the spray increases, and successful cleaning of particles from small features often requires energy above a damage threshold for many types of small surface features.

FIG. 2 depicts an existing mega-sonic cleaning method in which a substrate 120 is held within a chamber 150 by a chuck 160. The substrate 120 is immersed in a fluid 170 within the chamber 150, and a transducer 180 emits megasonic energy 190 at a high frequency to remove particles and residue from a surface of the substrate 120. This method causes cavitation at the surface of the substrate to dislodge the residual particles, but the cavitational forces can damage features on the surface depending on the megasonic energy level. The existing methods shown in FIGS. 1 and 2 are difficult to control because they create a fluid amalgam of compressible fluids and incompressible fluids on the surface of the substrate.

FIG. 3 shows a simplified depiction of the compressible and incompressible fluid amalgam 126 that occurs with conventional techniques. A nozzle 110 represents a conventional nozzle for use with nano-spray, Ocean-spray, M-jet, N-jet, or similar techniques. The nozzle 110 delivers a spray 140 onto the substrate 120 through air, an inert gas, or another type of compressible fluid medium 130. The substrate 120 contains features 122 that project upwardly from and/or recede below the surface of the substrate 120. (It is to be appreciated that the dimensions are not necessarily to scale.) Some features may extend above the surface 127 of the accumulated amalgam 126. As the spray strikes the surface of the substrate 120, the turbulence in the spray causes the incompressible fluid of the spray 140 to mix with the compressible ambient fluid 130. This mix 124 has highly varying pressure zones throughout. The mix 124 causes compressible fluid to accumulate in the amalgam 126 and congregate at regions of the surface of the substrate 120. This can cause an unpredictable and adverse pressure differential between regions that contact the amalgam mix 128 and those that do not 129. A similar amalgam mix occurs through cavitation caused by other, non-spray techniques such as mega-sonic cleaning techniques.

Another cleaning method (not shown) uses a bulk flow of fluid across a surface of a substrate in order to remove particles from the surface features of the substrate. The fluid boundary layer at the surface of the substrate in such a fluid flow is generally much larger than the height of the features; as a result, the flow velocity at the level of the features is too low to substantially assist in particulate removal. Despite changing variables such as flow velocity and fluid properties, it is difficult or impossible to reduce the boundary layer to effectively remove particles from the substrate surface. As such, the small size of the surface features and of the residue particles renders this method ineffective.

In summary, conventional cleaning methods may not satisfactorily provide effective cleaning at the substrate surface without damaging the very small surface features in current high-density dies. Moreover, existing nano-spray and megasonic methods generally require a compromise between the desired degree of particle removal and the acceptable amount of feature damage. In light of the existing cleaning techniques, there is a need for a cleaning method that can successfully remove particles and residue from a substrate surface without damaging the features.

DETAILED DESCRIPTION

Figure 1:
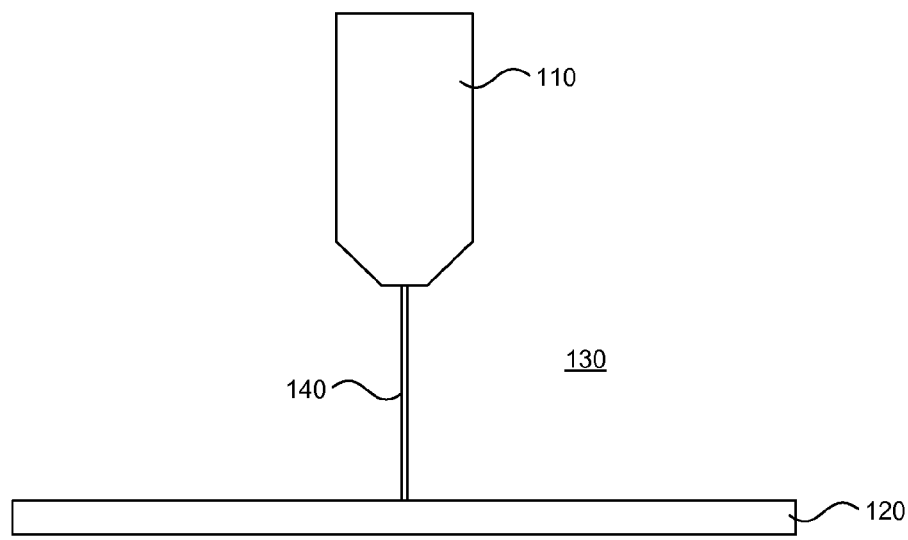
FIG. 1 is a partially schematic cross-sectional view of a cleaning method in accordance with the prior art.
Figure 2:
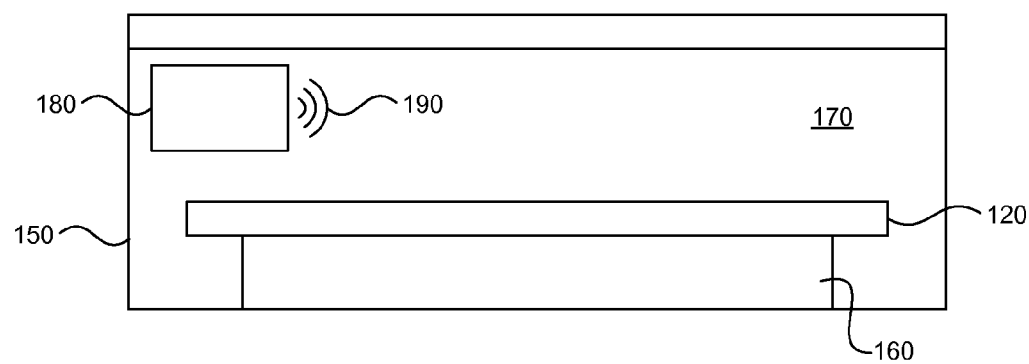
FIG. 2 is a partially schematic cross-sectional view of a cleaning method in accordance with the prior art.
Figure 3:
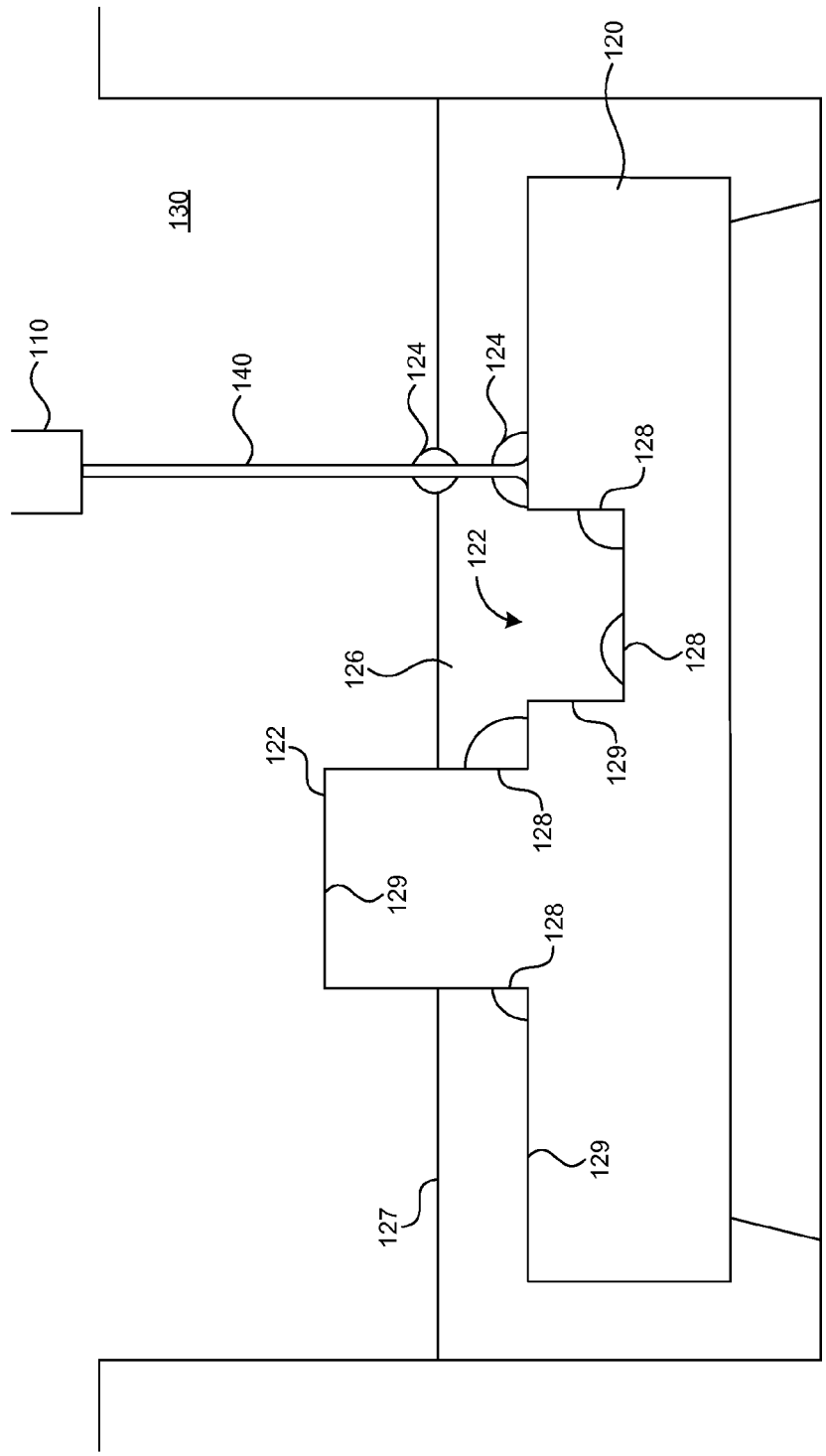
FIG. 3 is a partially schematic cross-sectional view of a cleaning method in accordance with the prior art.

Specific details of several embodiments of the new technology are described below with reference to methods for cleaning wafers with an immersed stream or an immersed spray nozzle, and the associated systems and apparatuses. Microelectronic dies with integrated circuitry can be used in microelectronic device packages, such as processors or memory devices, thin-film recording heads, data storage elements, micro fluidic devices, and other types of devices. Micromachines and micromechanical devices are included within this definition because they are manufactured using technology similar to that used in the fabrication of integrated circuits. The term "substrate" or "microfeature substrate" are used throughout to include semiconductor substrates and other types of substrates upon which and/or in which semiconductor devices, other types of microelectronic devices, micromechanical devices, data storage elements, read/write components, and other features are fabricated. Suitable materials for substrates can include semiconductor pieces (e.g., doped silicon wafers or gallium arsenide wafers), non-conductive pieces (e.g., various ceramic substrates), quartz, chrome, TEOS, or conductive pieces. Microfeature substrates can also include a wide variety of electrical components, mechanical components, and/or systems of such components (e.g., integrated circuits, memory devices, processors, imagers, micromechanical systems, etc.). The term "surface" can encompass planar and nonplanar surfaces of a semiconductor substrate either with or without patterned and non-patterned features. A person skilled in the relevant art will also understand that the new technology may have additional embodiments, and that the new technology may be practiced without several of the details of the embodiments described below with references to FIGS. 4, 5, 6A, and 6B.

An example of system for removing particles from a surface of a semiconductor substrate comprises a chamber having a volume configured to contain a first incompressible fluid at a fluid surface elevation and a substrate support below the fluid surface elevation. The substrate support is configured to hold the semiconductor substrate below the fluid surface elevation to be immersed in the first incompressible fluid. The system can further include a nozzle having an orifice configured to direct a stream of a second incompressible fluid from the nozzle onto a surface of the substrate. The orifice of the nozzle is positioned below the fluid surface elevation to be immersed in the first incompressible fluid. In operation, the system can implement a method for removing residual particles from a semiconductor wafer that comprises immersing at least a portion of a semiconductor wafer in a first incompressible fluid and flowing a stream of a second incompressible fluid through the first incompressible fluid. The second incompressible fluid impinges against a discrete area of the semiconductor wafer and detaches residual particles from the surface of the semiconductor wafer.

Figure 4:
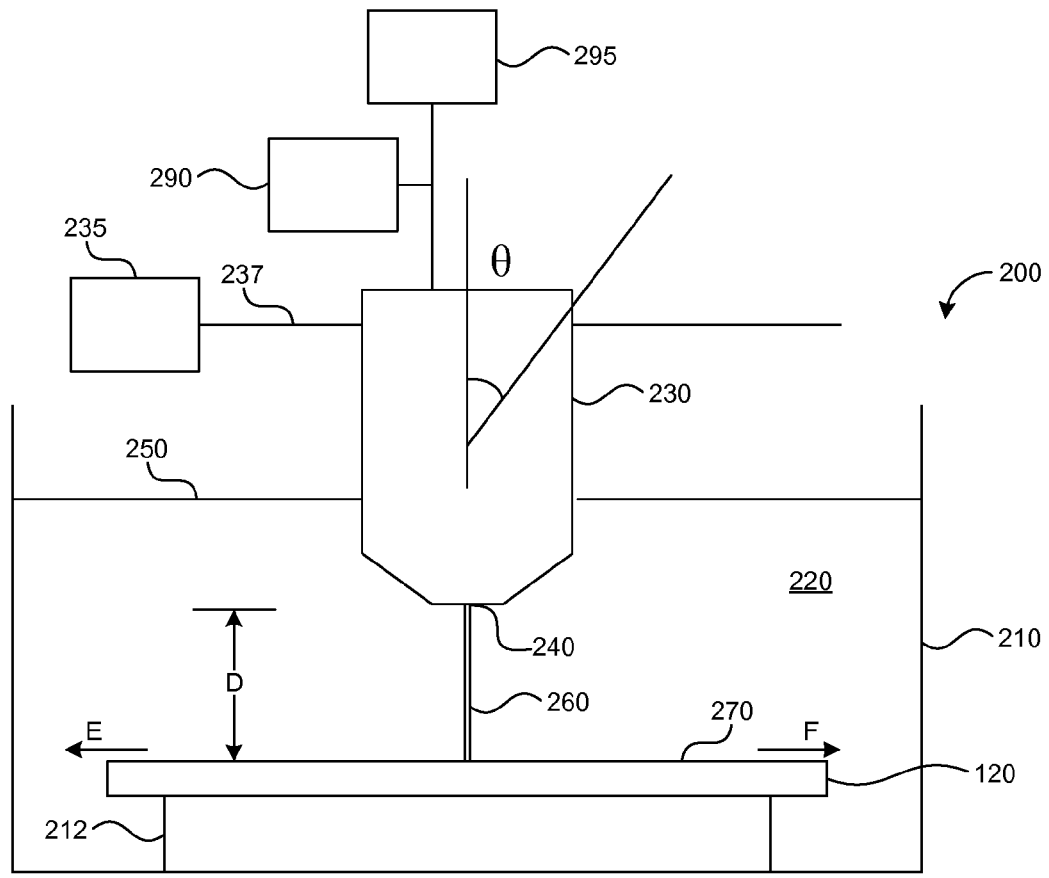
FIG. 4 is a partially schematic cross-sectional view of a cleaning method in accordance with an embodiment of the new technology.

Several embodiments of a cleaning system 200 in accordance with the new technology are depicted in FIG. 4. In one embodiment, the cleaning system 200 includes a chamber 210 having a volume configured to contain a first incompressible fluid 220 (e.g., deionized water, isopropyl, ethanol, ammonium hydroxide, etc.) at a fluid surface elevation 250. The system 200 can also include a substrate support 212 configured to hold a semiconductor substrate 120 below the fluid surface elevation 250 such that the substrate 120 is immersed in the first incompressible fluid 220. The system 200 further includes a nozzle 230 at least partially in the chamber 210. The nozzle 230 can be positioned above the substrate 120 and have a nozzle orifice 240 below the fluid surface level 250. In operation, the nozzle 230 directs a stream of a second incompressible fluid 260 through the first incompressible fluid and onto a surface 270 of the substrate 120. The second incompressible fluid 260 and the first incompressible fluid 220 can both be liquids, such as deionized water. In several embodiments, the first and second incompressible fluids 220 and 260 can be the same fluid, or they can be different types of fluids.

The system 200 can also have a fluid regulator 290 that regulates the flow of the second incompressible fluid 260 from a fluid source 295 through the nozzle 230. The stream of second incompressible fluid 260, for example, can be regulated by the fluid regulator 290 to prevent (a) turbulence or cavitation at the surface of the substrate 120 and/or (b) gasses or other compressible fluids from entering the stream of the second incompressible fluid 260 or otherwise contacting the surface 270 of the substrate 120.

The exit velocity of the stream of second incompressible fluid 260 at the nozzle orifice 240 can be selected to provide adequate cleaning without unacceptable damage to the semiconductor substrate 120. In some embodiments, the exit velocity can range from 1 meter per second to 30 meters per second (or higher). The exit velocities are a function of, among other things, the diameter/size of the nozzle orifice 240 and/or the pressure of the second incompressible fluid. In some embodiments, the diameter of the nozzle orifice 240 can be about 250-500 microns, but the nozzle orifice 240 can have other sizes. The fluid source 295 can be pressurized at about 20-70 psi, but other pressures can be used. In some embodiments, the nozzle orifice 240 is positioned above the surface 270 by a distance D, which can be about 0-10 millimeters. The distance D, for example, can be 1.7 mm. The system 200 can optionally include an actuator 235 for moving the nozzle 230 along a path 237 to impinge the stream of second incompressible fluid 260 over a plurality of discrete portions of the substrate surface 270. In operation, the nozzle 230 and/or the substrate can be moved relative to each other to direct the stream of second incompressible fluid 260 to different portions of the surface 270. For example, the actuator 235 can move the nozzle 230 back and forth generally parallel with the surface 270 of the substrate 120 such that the stream of second incompressible fluid 260 impinges substantially the entire surface 270. In other embodiments, the substrate 120 can move relative to the nozzle 230. In alternative configurations, the substrate 120 can be positioned substantially vertically and the nozzle 230 can be configured to direct the stream of second incompressible fluid 260 approximately horizontally onto the substrate 120. FIG. 4 illustrates the nozzle 230 oriented such that the stream of second incompressible fluid 260 impinges upon the substrate 120 at an angle substantially normal to the surface 270. However, the nozzle 230 can be positioned at an angle θ relative to normal, which can vary both positively and negatively from normal. In some embodiments, θ is approximately 45° or −45°. It should be appreciated by a person of ordinary skill in the art that the angle θ can vary in more than one direction. In addition, the nozzle 230 can be moved through an angle θ while either the nozzle 230 or the substrate 120 is being moved.

According to some embodiments of the new technology, the bulk of the first incompressible fluid 220 is still (e.g., not flowing relative to the surface 270 of the substrate 120). In other embodiments, the first incompressible fluid 220 can flow through the chamber 210. For example, the first incompressible fluid 220 can be directed in a cross flow relative to the surface 270 that flows from a first end of the chamber to a second end of the chamber, or in the reverse direction (arrows F and E). The cross flow of the first incompressible fluid 220 can carry particles and residue dislodged by the stream of second incompressible fluid 260 away from the substrate 120 and eventually out of the system 200. In some embodiments, the cross flow of the first incompressible fluid 220 is relatively low (e.g., approximately 2 meters per second or less) compared to the stream of second incompressible fluid 260 so that the stream of second incompressible fluid 260 can penetrate the fluid boundary layer of the cross flow and clean the surface 270 of the substrate 120.

Figure 5:
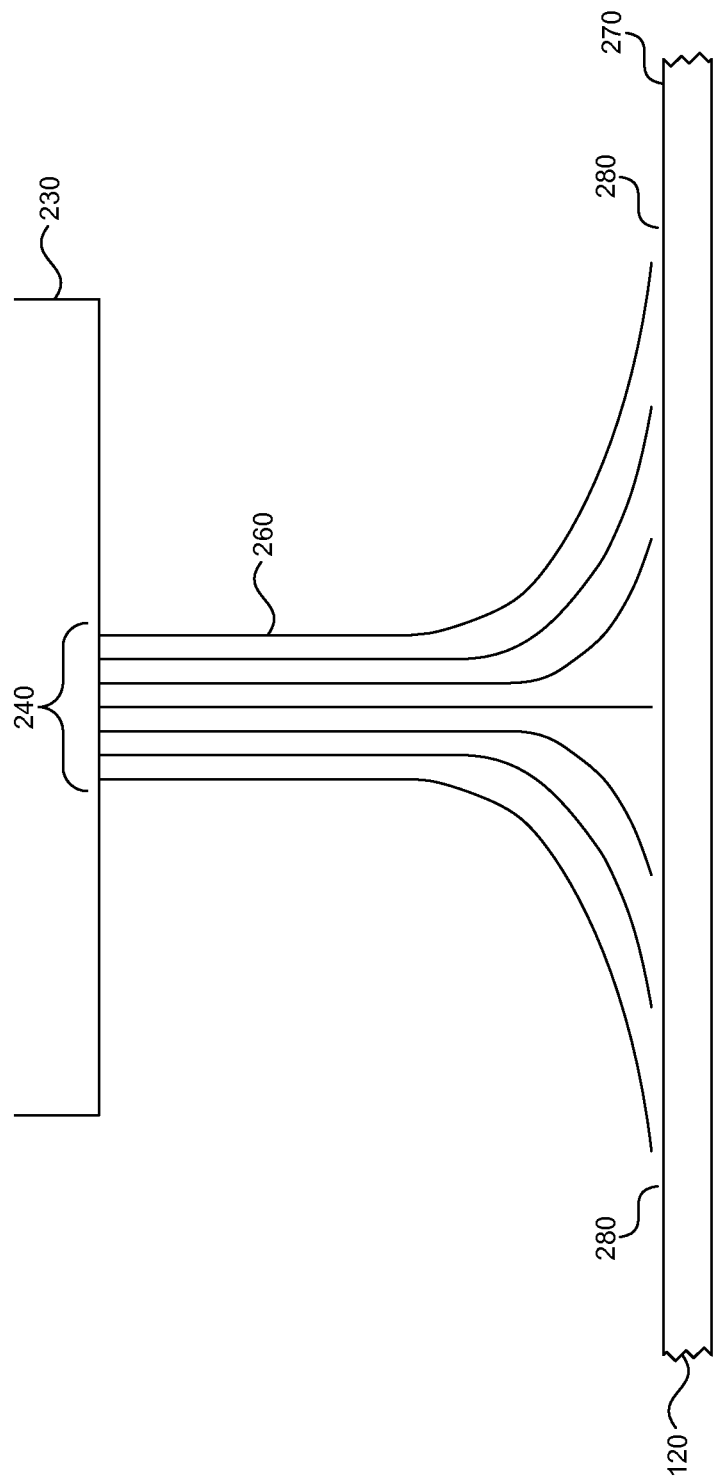
FIG. 5 is a partially schematic cross-sectional view of surface flow of an impinging fluid stream.

FIG. 5 illustrates an approximation of the fluid flow of the stream of second incompressible fluid 260 at the surface 270 of a small portion of the substrate 120. The stream of second incompressible fluid 260 impinges a discrete area of the substrate surface as it moves substantially parallel to the surface 270. The stream of second incompressible fluid 260 removes particles and residue from the surface 270 at locations 280 adjacent to the discrete impingement site, but not directly impinged by the stream of second incompressible fluid 260.

One advantage of selected embodiments of the new technology is that particles can be removed from semiconductor substrates without unacceptable levels of feature damage. For example, because the first and second fluids 220 and 260 are both incompressible, at any given point in time the pressure gradient between the discrete area on the substrate surface 270 being impinged by the stream of the second incompressible fluid 260 and the surrounding substrate surface area not being impinged is less than if the first fluid was a compressible gas (e.g., air or Nitrogen). The first incompressible fluid 220 in effect supports the areas of the substrate surface adjacent the discrete site being impinged by the stream of the second incompressible fluid 260 to provide a counter force that protects the surface features on the substrate. Nonetheless, the flow velocity of the stream of second incompressible fluid 260 at the discrete impingement site can be quite high. Several embodiments of the system 200, therefore, can sufficiently remove particles and other residual matter from even small features without unacceptable levels of feature damage.

Another advantage of selected embodiments of the new technology is that the process time for cleaning wafers may be reduced. Because the nozzle 230 is immersed within the fluid 220 and no compressible fluid is present at the substrate surface, the stream of second incompressible fluid 260 causes rapid, surface-level flows that effectively remove particles from an area of the surface 270 larger in diameter than the diameter of the stream of second incompressible fluid 260. The effective particle removal zone is larger than the diameter of the stream of second incompressible fluid 260. As a result, the entire surface 270 of the substrate 120 can be cleaned with fewer passes of the nozzle 230 relative to the substrate surface.

Figure 6A:
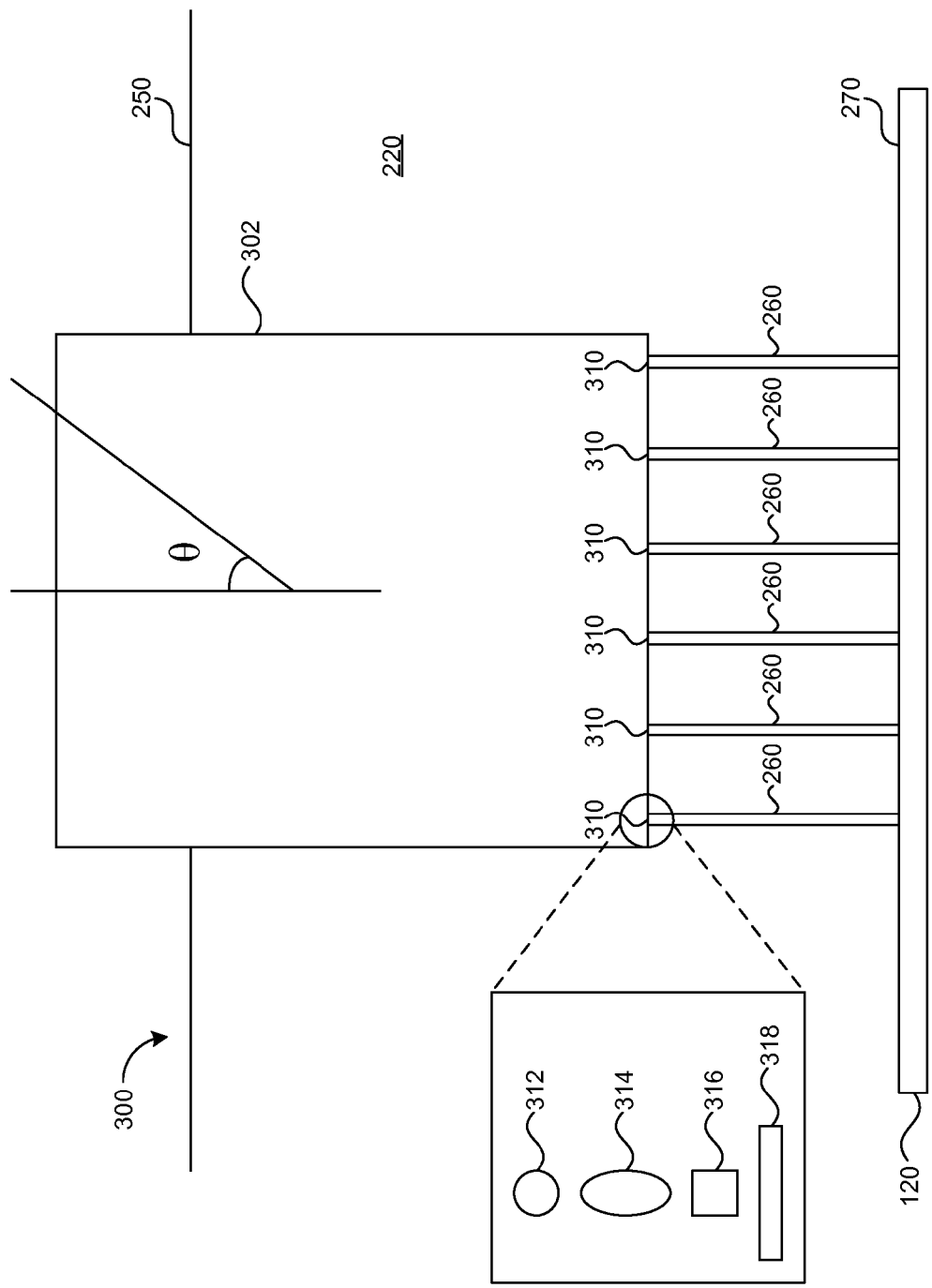
FIGS. 6A and 6B are partially schematic cross-sectional views of alternative nozzle configurations in accordance with embodiments of the new technology.
Figure 6B:
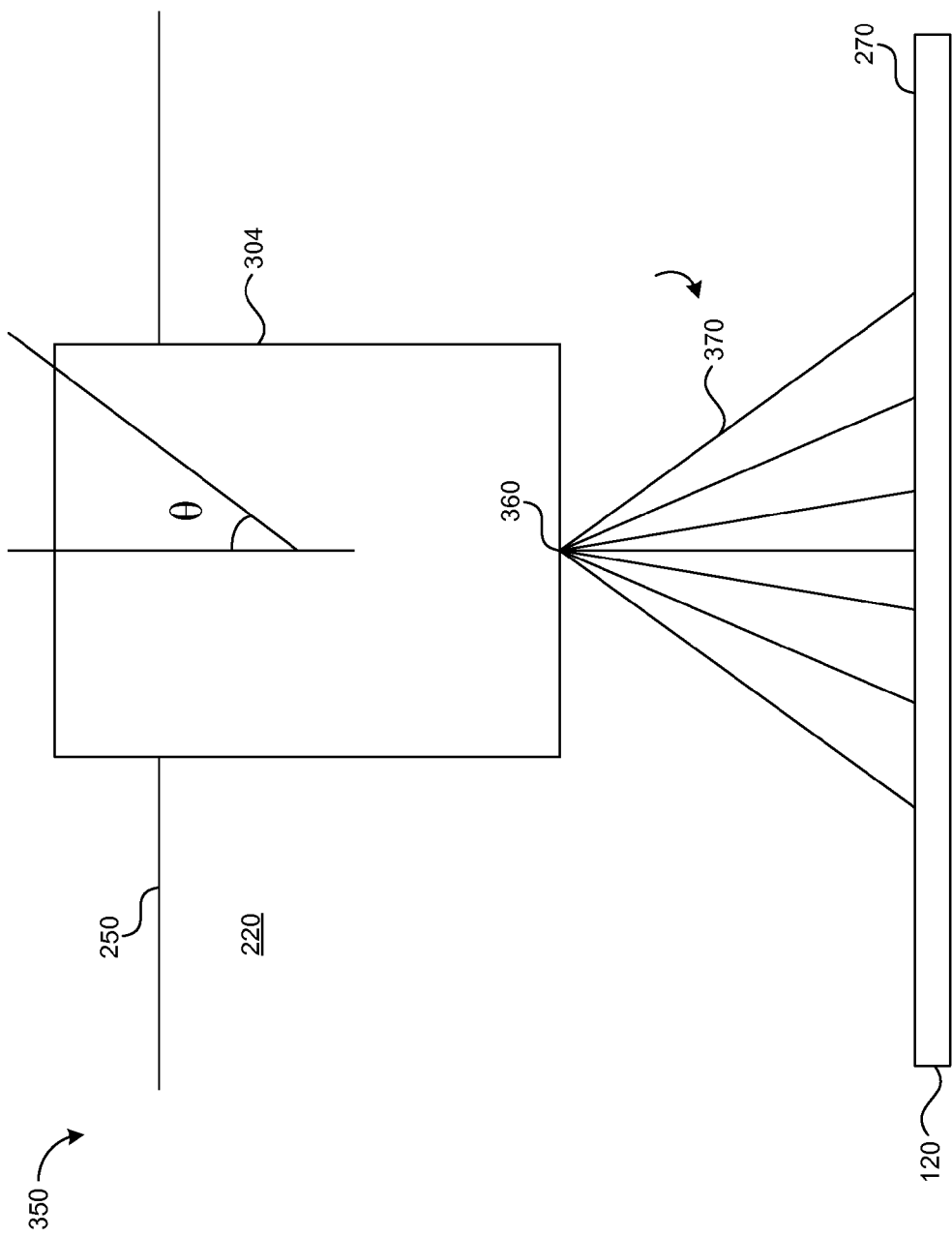

FIGS. 6A and 6B illustrate several nozzle orifice configurations according to embodiments of the new technology. FIG. 6A illustrates a shower-head configuration 300 having a nozzle 302 with a plurality of nozzle orifices 310 that each direct a stream of the second incompressible fluid 260 onto the surface 270 of the substrate 120. The nozzle orifices 310 can have different shapes, such as a circle 312, an oval 314, a square 316, or an elongated slit 318. Of course, other configurations and combinations of these shapes can be used. In some embodiments, each of stream of the second incompressible fluid 260 is substantially as described above with respect to FIGS. 4 and 5. The nozzle 302 can be positioned below the fluid level surface 250 such that only incompressible fluid reaches the surface 270. This configuration causes the streams of the second incompressible fluid 260 to impinge upon several areas of the surface 270 simultaneously, and allows more fluid to reach the surface 270.

FIG. 6B shows another embodiment of a nozzle 304 that produces a divergent stream configuration. Similar to embodiments described above, the nozzle 304 is positioned below the fluid level surface 250. The nozzle 304 can produce divergent streams 370 of the second incompressible fluid from a plurality of divergent nozzle orifices 360 to simultaneously clean several areas of the surface 270 of the substrate 120. These alternative embodiments can be selected according to a given implementation of the cleaning system 200, and provide different particle removal characteristics. It is to be appreciated that these configurations can be practiced in conjunction with one another. For example, the new technology contemplates a nozzle 302 with multiple orifices such as in FIG. 6A, where at least some of the orifices 310 are divergent spray nozzles as described with respect to FIG. 6B. Also, the angle θ can be varied in each of these alternate embodiments as well.

In some embodiments, a method for removing residual particles from a semiconductor wafer includes immersing at least a portion of a semiconductor wafer in a first incompressible fluid. A nozzle orifice is immersed in the first incompressible fluid. The first incompressible fluid flows towards the semiconductor wafer such that the first compressible fluid produces a cross flow that flows along and is substantially parallel to a surface of the semiconductor wafer. A stream of a second incompressible fluid flows from the nozzle orifice through the first incompressible fluid, whereby the stream of the second incompressible fluid is substantially perpendicular to the surface of the semiconductor wafer and is substantially perpendicular to a direction of the first incompressible fluid flowing along the surface of the semiconductor wafer. The first incompressible fluid is delivered through a first opening into a chamber. The first compressible fluid flows across the surface of the semiconductor wafer, and the first incompressible fluid flows through an exit of the chamber opposite the first opening.

In some embodiments, a method for removing material from a semiconductor substrate comprises immersing at least a portion of a semiconductor substrate in a first incompressible fluid. A nozzle orifice is immersed in the first incompressible fluid. The first incompressible fluid flows in a direction that is substantially parallel to a surface of the semiconductor substrate. A second incompressible fluid flows from the nozzle orifice and through the flow of the first incompressible fluid such that the flow of the second incompressible fluid passes through a boundary layer of the flow of the first incompressible fluid along the surface of the semiconductor substrate. The second incompressible fluid flows in a direction that is substantially perpendicular to the surface of the semiconductor substrate and substantially perpendicular to the direction of the flow of the first incompressible fluid flowing along the surface of the semiconductor substrate. In one embodiment, the first incompressible fluid flows to cause the first incompressible fluid to enter a first opening of a chamber, to flow across the surface of the semiconductor substrate, and to exit the chamber through a second opening that is opposite the first opening.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

From the foregoing, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding, but rather the invention includes any and all other embodiments defined by the claims.

I claim:

1. A method for removing residual particles from a semiconductor wafer, comprising:
   immersing at least a portion of a semiconductor wafer in a first incompressible fluid;
   immersing a nozzle orifice in the first incompressible fluid;
   flowing the first incompressible fluid towards the semiconductor wafer such that the first compressible fluid produces a cross flow that is substantially parallel to and that flows along a surface of the semiconductor wafer; and
   flowing a stream of a second incompressible fluid from the nozzle orifice through the first incompressible fluid, whereby the stream of the second incompressible fluid is substantially perpendicular to the surface of the semiconductor wafer and is substantially perpendicular to a direction of the first incompressible fluid flowing along the surface of the semiconductor wafer.

2. The method of claim 1 wherein the first and second incompressible fluids are the same type of fluid.

3. The method of claim 1 wherein flowing a stream of a second incompressible fluid from the nozzle orifice comprises flowing a stream through a plurality of nozzle orifices.

4. The method of claim 3 wherein the plurality of nozzle orifices have a plurality of different shapes and/or sizes.

5. The method of claim 1 wherein the orifice is positioned approximately 1.7 millimeters above the semiconductor wafer.

6. The method of claim 1, further comprising moving at least one of the stream and the semiconductor wafer relative to the other in a direction generally parallel to a surface of the semiconductor wafer.

7. The method of claim 1 wherein the stream of the second incompressible fluid flows at a velocity of at least approximately 30 meters per second.

8. The method of claim 1 wherein the first incompressible fluid is positioned in a chamber having a first end and a second end, the chamber being configured to enable the first incompressible fluid to flow into the chamber from the first end and to exit the chamber from the second end.

9. The method of claim 8 wherein the first incompressible fluid flows through the chamber from the first end to the second end in a direction generally parallel to the surface of the semiconductor wafer.

10. The method of claim 8 wherein the chamber is further configured to receive a plurality of semiconductor wafers in series, and wherein the stream of the second incompressible fluid impinges upon at least a portion of each semiconductor wafer in the series.

11. The method of claim 8 wherein the first incompressible fluid moves through the chamber at a velocity of at least approximately 2 meters per second.

12. The method of claim 1, further comprising moving the stream of the second incompressible fluid between approximately 45 degrees and −45 degrees from normal.

13. The method of claim 12, further comprising moving the semiconductor wafer relative to the stream of the second incompressible fluid.

14. The method of claim 1 wherein the stream has a diameter of approximately 250 microns in diameter.

15. The method of claim 1 wherein the flow of the second incompressible fluid is configured to impinge upon the surface of the semiconductor wafer.

16. The method of claim 1, further comprising regulating the first incompressible fluid and the stream of the second incompressible fluid to prevent compressible fluids from entering the first incompressible fluid or the stream of the second incompressible fluid and from contacting the semiconductor wafer.

17. The method of claim 1, further comprising regulating the stream of the second incompressible fluid to keep the stream below an energy level that damages the semiconductor wafer surface.

18. The method of claim 17 wherein regulating the stream of the second incompressible fluid comprises regulating at least one of the following variables: fluid pressure in the stream, stream diameter, stream velocity, stream shape, duration of impingement, viscosity of the second incompressible fluid, and contents of the second incompressible fluid.

19. The method of claim 1, further comprising flowing the first incompressible fluid at a flow speed sufficient to carry away particles and dislodged residue produced by the stream and less than about 2 meters per second.

20. The method of claim 1, further comprising delivering the first incompressible fluid through a first opening into a chamber, flowing the first compressible fluid across the surface of the semiconductor wafer, and flowing the first incompressible fluid through an exit of the chamber opposite the first opening.

21. The method of claim 1, further comprising causing the flow of the first incompressible fluid to travel in a first direction towards the semiconductor wafer, travel in the first direction across a first edge of the semiconductor water, and flow in the first direction across the entire surface of the semiconductor wafer and past a second edge of the semiconductor wafer.

22. The method of claim 1, further comprising delivering the stream of the second incompressible fluid through a boundary layer of the flow of the first incompressible fluid passing along the surface of the semiconductor wafer.

23. A method for removing material from a semiconductor substrate, comprising:
   immersing at least a portion of a semiconductor substrate in a first incompressible fluid;
   immersing a nozzle orifice in the first incompressible fluid;
   flowing the first incompressible fluid in a direction that is substantially parallel to a surface of the semiconductor substrate; and
   flowing a second incompressible fluid from the nozzle orifice and through the flow of the first incompressible fluid such that the flow of the second incompressible fluid passes through a boundary layer of the flow of the first incompressible fluid along the surface of the semiconductor substrate, and wherein the second incompressible fluid flows in a direction that is substantially perpendicular to the surface of the semiconductor substrate and substantially perpendicular to the direction of the flow of the first incompressible fluid flowing along the surface of the semiconductor substrate.

24. The method of claim 23 wherein flowing the first incompressible fluid includes causing the first incompressible fluid to enter a first opening of a chamber, to flow across the surface of the semiconductor substrate, and to exit the chamber through a second opening that is opposite the first opening.

25. The method of claim 23, further comprising holding the first incompressible fluid in a chamber configured to cause the first incompressible fluid to flow in a direction that is substantially parallel to the surface of the semiconductor substrate and at a flow speed at least about 2 meters per second.

26. The method of claim 23 wherein the first incompressible fluid flows at a sufficient flow speed so as to carry particles dislodged by the stream of the second incompressible fluid away from the semiconductor substrate.

27. The method of claim 23, further comprising flowing the first incompressible fluid across substantially the entire surface of the semiconductor substrate.

* * * * *

UNITED STATES PATENT AND TRADEMARK OFFICE
CERTIFICATE OF CORRECTION

PATENT NO. : 8,454,760 B2  
APPLICATION NO. : 12/476139  
DATED : June 4, 2013  
INVENTOR(S) : Donald L. Yates Page 1 of 1

It is certified that error appears in the above-identified patent and that said Letters Patent is hereby corrected as shown below:

In the Claims:

In column 8, line 33, in Claim 21, delete "water," and insert -- wafer, --, therefor.

Signed and Sealed this
Seventeenth Day of September, 2013

Teresa Stanek Rea
*Deputy Director of the United States Patent and Trademark Office*